(12) United States Patent
Zhang et al.

(10) Patent No.: US 10,211,102 B2
(45) Date of Patent: Feb. 19, 2019

(54) NON-VOLATILE MEMORY DEVICE AND METHOD FOR MANUFACTURING THE SAME

(71) Applicant: SEMICONDUCTOR MANUFACTURING INTERNATIONAL (SHANGHAI) CORPORATION, Shanghai (CN)

(72) Inventors: Jinshuang Zhang, Shanghai (CN); Shengfen Chiu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 22 days.

(21) Appl. No.: 15/001,004

(22) Filed: Jan. 19, 2016

(65) Prior Publication Data
US 2016/0225778 A1    Aug. 4, 2016

(30) Foreign Application Priority Data
Feb. 4, 2015 (CN) .......................... 2015 1 0058669

(51) Int. Cl.
*H01L 27/11543*    (2017.01)
*H01L 27/11575*    (2017.01)
(Continued)

(52) U.S. Cl.
CPC .. *H01L 21/76886* (2013.01); *H01L 21/28273* (2013.01); *H01L 21/28518* (2013.01); *H01L 21/76897* (2013.01); *H01L 27/11536* (2013.01); *H01L 27/11541* (2013.01); *H01L 29/665* (2013.01); *H01L 29/6656* (2013.01);
(Continued)

(58) Field of Classification Search
CPC ......... H01L 27/11521; H01L 21/76897; H01L 29/7883; H01L 29/665; H01L 29/66825; H01L 27/11534; H01L 29/6656; H01L 21/76886; H01L 29/456; H01L 21/28273; H01L 21/02063; H01L 257/321;
(Continued)

(56) References Cited

U.S. PATENT DOCUMENTS

2010/0210099 A1* 8/2010 Hur .................. H01L 27/11524
438/586
2013/0069142 A1* 3/2013 Matsuo ............. H01L 21/76232
257/326
(Continued)

*Primary Examiner* — Moazzam Hossain
*Assistant Examiner* — Stanetta Isaac
(74) *Attorney, Agent, or Firm* — Kilpatrick Townsend & Stockton LLP

(57) ABSTRACT

A method for manufacturing a semiconductor device includes providing a semiconductor substrate having a core region and a peripheral region, and prior to forming a metal silicide in the core region, forming a sidewall layer on opposite sides of a gate structure of a core region device. The sidewall layer includes sequentially, from the inside out, a silicon oxide layer, a first silicon nitride layer, a first silicon nitride layer, a second silicon oxide layer, and a second silicon nitride layer, or the sidewall layer includes, from inside out, a first silicon nitride layer and a second silicon nitride layer. The sidewall layer having such structure ensures that the formed metal silicide has a good morphology in the core region to achieve good device performance.

14 Claims, 14 Drawing Sheets

(51) Int. Cl.
    *H01L 27/11512*    (2017.01)
    *H01L 21/768*      (2006.01)
    *H01L 21/28*       (2006.01)
    *H01L 29/66*       (2006.01)
    *H01L 29/788*      (2006.01)
    *H01L 27/11536*    (2017.01)
    *H01L 27/11541*    (2017.01)
    *H01L 21/285*      (2006.01)
    *H01L 21/02*       (2006.01)

(52) U.S. Cl.
    CPC .... *H01L 29/6659* (2013.01); *H01L 29/66825* (2013.01); *H01L 29/7881* (2013.01); *H01L 21/02063* (2013.01); *H01L 21/76843* (2013.01); *H01L 21/76855* (2013.01)

(58) Field of Classification Search
    CPC ........... H01L 27/11543; H01L 29/6684; H01L 29/788; H01L 29/78391
    See application file for complete search history.

(56) References Cited

U.S. PATENT DOCUMENTS

2015/0372121 A1* 12/2015 Chen ................. H01L 29/66825
                                                  257/320
2016/0181266 A1*  6/2016 Chuang ............. H01L 27/11541
                                                  257/316

* cited by examiner

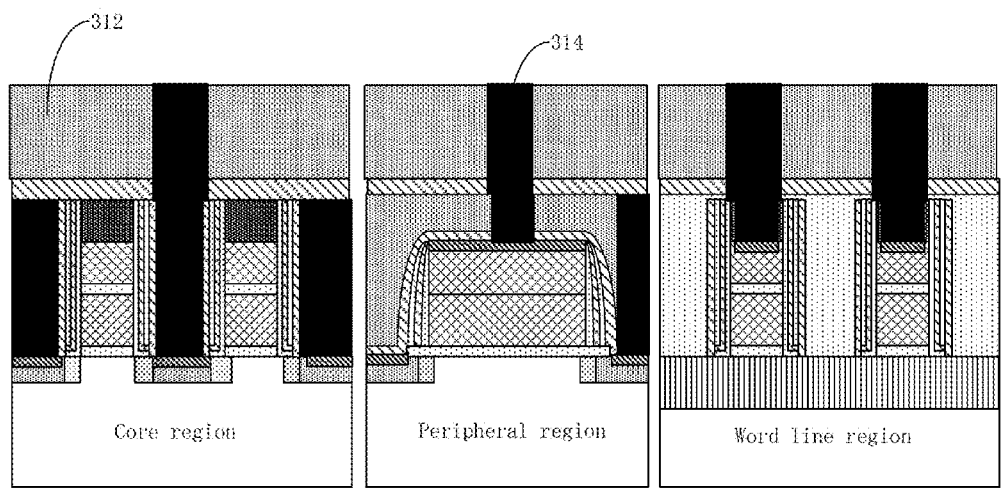
*Fig. 1W*
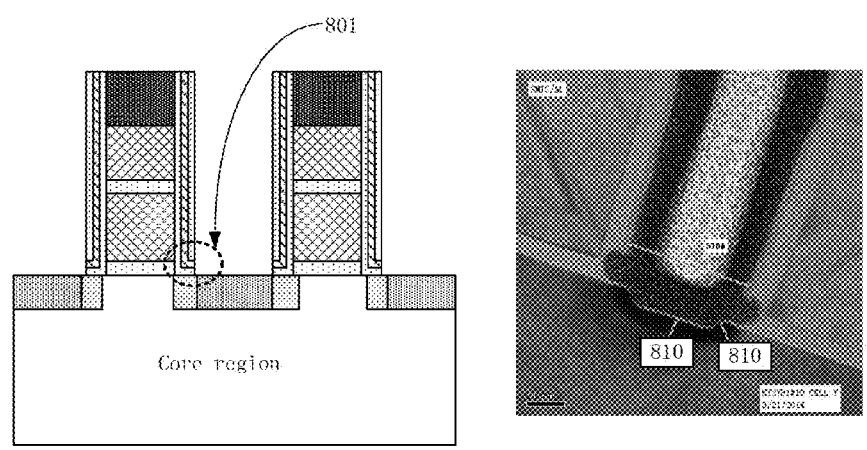
*Fig. 2A*  *Fig. 2B*

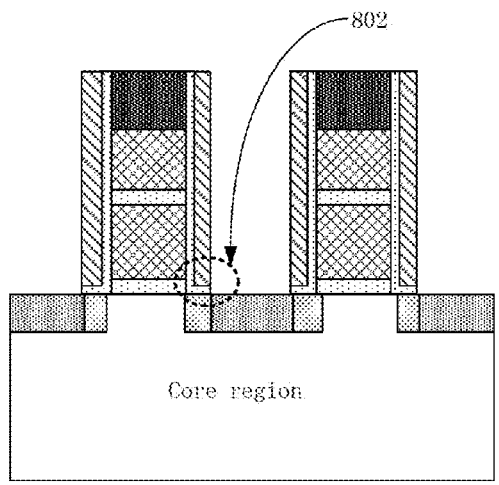
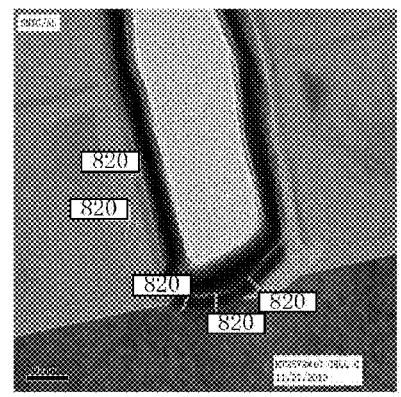
Fig. 3A                    Fig. 3B
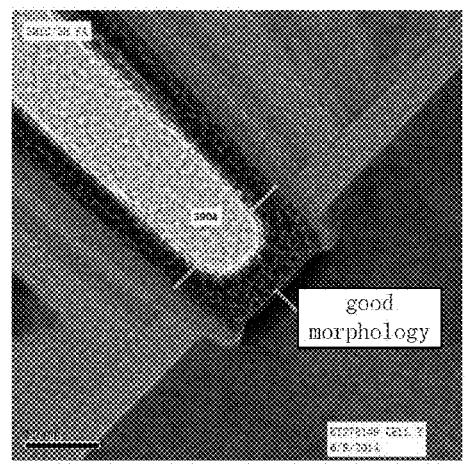
Fig. 4

NON-VOLATILE MEMORY DEVICE AND METHOD FOR MANUFACTURING THE SAME

CROSS-REFERENCES TO RELATED APPLICATIONS

This application claims priority to Chinese patent application No. 201510058669.0, filed Feb. 4, 2015, the content of which is incorporated herein by reference in its entirety.

FIELD OF INVENTION

The present invention relates to semiconductor technology, and more particularly to a semiconductor device and manufacturing method thereof.

BACKGROUND OF THE INVENTION

In non-volatile memory (NVM) devices, as the feature sizes of devices in the core region are reduced to less than 55 nm, the pitch of the active region (AA pitch) is reduced to less than 122 nm so that the process can no longer utilize the self-aligned process. The associated spacing of the control gate is reduced to 230 nm, after the deposition of the sidewall layer in the core region, the width of the sidewall will be reduced to less than 60 nm, resulting in a very high aspect ratio in the core region (greater than 6). Thus, depositing a nickel layer in the active region at the bottom of the core region to form a nickel silicide is a challenging process. Forming a metal silicide in the core region can reduce the surface resistance (Rs) of the contact hole (CT) and the surface resistance of the word line region (WL strap), which will improve the program cycle and erase cycle performance of a storage unit.

A conventional method for manufacturing a semiconductor device may include first forming a control gate in the core region by etching, then forming a gate in the peripheral region. The method may include performing an annealing process in the metal silicide in the peripheral region, and then performing an annealing process of the metal silicide in the core region. In this method, the sidewall may be a two-layer structure including silicon oxide/silicon nitride (ON) or a three-layer structure including silicon oxide/silicon nitride/silicon oxide (ONO).

In the prior art method, prior to forming a metal silicide, a wet etching process is performed to remove the native oxide, the bottom portion of the silicon oxide layer of the sidewall may be subjected to etching, which causes the etching solution to enter the tunnel oxide layer, thereby affecting the device performance.

Furthermore, because a metal silicide is first formed in the peripheral region, and an annealing process is performed thereon, thereafter, a metal silicide is formed in the core region following by an annealing process. Therefore, heat generated in the annealing process in the core region may affect a device in the peripheral region. Thus, it is very difficult to form a metal silicide in the core region while ensuring the device in the peripheral region is not affected by the additional heat.

In the conventional method for manufacturing a semiconductor device, the process of forming a metal silicide in the core region is different from that of forming a metal silicide in the peripheral region. A nickel metal silicide in the peripheral region is formed using two rapid thermal annealing (RTA) processes, the first RTA process is performed at a low temperature, so that nickel reacts with silicon to form nickel silicide (NiSi), the second RTA process is performed at a high temperature so that the nickel silicide is transformed from a high-impedance state to a low-resistance state. After titanium (Ti) or titanium nitride (TiN) is deposited in the contact hole in the core region, a annealing process is required to be carried out at 600° C. to 730° C. to form $TiSi_2$.

Nickel metal silicide cannot withstand high temperature. Under high temperature, nickel silicide NiSi will be converted to $NiSi_2$, which has a high resistance. However, forming a titanium silicide from titanium requires a higher temperature than forming a nickel silicide from nickel. When the temperature is higher than 600° C., the phase of the nickel silicide may be altered. Thus, in order to ensure that the phase of the nickel silicide will not be altered in the formation of titanium silicide, the annealing temperature of the titanium silicide should be less than 600° C., then titanium can only be converted to $TiSi_2$ which has a resistance much larger than the resistance of the nickel silicide.

Thus, there is a motivation to provide a method for improving the quality and performance of a semiconductor device.

BRIEF SUMMARY OF THE INVENTION

Embodiments of the present invention provide a method for manufacturing a semiconductor device with metal silicide in the core and peripheral regions having good morphology.

According to one embodiment of the present invention, a method for manufacturing a semiconductor device includes the following steps:

S101: providing a semiconductor substrate having a core region and a peripheral region; sequentially forming a tunnel oxide layer; a floating gate material layer, a gate dielectric layer, a control gate material layer, and a hardmask layer on the semiconductor substrate; performing an etching process on the hardmask layer, the control gate material layer, the gate dielectric layer, and the floating gate material layer in the core region to form a gate structure;

S102: forming a first sidewall layer on opposite sides of the gate structure, the first sidewall layer including a first silicon nitride layer or outwardly (from the inside out) a first silicon oxide layer, a first silicon nitride layer and a second silicon oxide layer;

S103: forming a second sidewall layer on the first sidewall layer, the second sidewall layer including a second silicon nitride layer covering the first sidewall layer;

S104: forming a first interlayer dielectric layer on the semiconductor substrate; removing a portion of the first interlayer dielectric layer in the peripheral region and a portion of the hardmask layer in the peripheral region; performing an etching process on a portion of the floating gate material layer and a portion of the control gate material layer in the peripheral region to form a gate of a peripheral device;

S105: forming a third sidewall layer on opposite sides of the gate of the peripheral device;

S106: depositing a nickel metal layer in the peripheral region; performing a rapid thermal annealing to form a nickel metal silicide; removing excess portions of the nickel metal layer;

S107: forming a second interlayer dielectric layer on the semiconductor substrate; removing a portion of the second interlayer dielectric layer located in the core region; performing a CMP on the second interlayer dielectric layer and the first interlayer dielectric layer; forming a contact hole in the core region and in the peripheral region;

S108: performing the following steps in the core region to form a metal silicide: depositing a nickel metal layer; performing a rapid thermal annealing to form a nickel metal silicide; and removing excess portions of the nickel metal; and performing a laser annealing.

In one embodiment, step S102 may include: sequentially forming a bottom silicon oxide layer on the semiconductor substrate through oxidation, depositing a silicon nitrite layer on bottom silicon oxide layer, and forming a top silicon oxide layer on the silicon nitrite layer in an oxidation furnace; and S1022: performing a dry etch process on top silicon oxide layer, silicon nitrite layer, and bottom silicon oxide layer to expose a top surface of the hardmask layer to form a first sidewall layer, the first sidewall layer including, from the inside out (outwardly), the first silicon oxide layer, the first silicon nitrite layer, and the second silicon oxide layer.

In one embodiment, step S103 includes S1031: forming a silicon nitride layer on the semiconductor substrate inside a deposition chamber; and S1032: performing a dry etching on an outer surface of the silicon nitride layer to form the second sidewall layer. The second sidewall layer covers the first sidewall layer.

In one embodiment, the method further includes, between steps S102 and S103, step S1023: forming a source and a drain on opposite sides of the gate structure in the core region.

In one embodiment, in step S107 the contact hole includes a contact hole located in a word line region; and step S108 further includes forming a nickel metal silicide in the contact hole in the word line region.

In one embodiment, in step S106 the deposited nickel metal layer has a thickness greater than 200 Å.

In one embodiment, in step S106 the rapid thermal annealing is performed at a temperature in a range between 200° C. and 350° C., and for a processing time duration greater than 20 seconds.

In one embodiment, in step S108 the rapid thermal annealing is performed at a temperature in a range between 200° C. and 350° C., and for a processing time duration greater than 20 seconds.

In one embodiment, in step S108 the laser annealing is performed at a temperature in a range between 700° C. and 1000° C., and for a time duration less than 1 second.

In one embodiment, in step S108 the deposited nickel metal layer has a thickness greater than 200 Å.

In one embodiment, the method further includes, after step S108, step S109 for forming a metal plug in the contact hole.

In accordance with embodiments the present invention, a method for manufacturing a semiconductor device may include providing a semiconductor substrate having a core region and a peripheral region, and prior to forming a metal silicide in the core region, and forming a sidewall layer on opposite sides of a gate structure of a core region device. The sidewall layer sequentially includes, from the inside out, a silicon oxide layer, a first silicon nitride layer, a first silicon nitride layer, a second silicon oxide layer, and a second silicon nitride layer, or the sidewall layer sequentially includes, from the inside out, a first silicon nitride layer and a second silicon nitride layer. The such structure of the sidewall layer ensures that the metal silicide in the core region has a good shape in the core region and good device performance.

Embodiments of the present invention also provide a semiconductor apparatus including an electronic component and a semiconductor device that is connected to the electronic component. The semiconductor device is fabricated according to the above-described process steps and includes the above-described characteristics.

The following description, together with the accompanying drawings, will provide a better understanding of the nature and advantages of the claimed invention.

BRIEF DESCRIPTION OF THE DRAWINGS

FIG. 2A is a schematic cross-sectional view of an ONO structure of a sidewall layer of the core region formed by a method for manufacturing a semiconductor device, as known in the prior art;

FIG. 2B is a cross-sectional view of a TEM picture showing a metal silicide structure of the sidewall layer of FIG. 2A;

FIG. 3A is a schematic cross-sectional view of an ON structure of a sidewall layer of the core region formed by a method for manufacturing a semiconductor device, as known in the prior art;

FIG. 3B is a cross-sectional view of a TEM picture showing a metal silicide structure of the sidewall layer of FIG. 3A;

FIG. 4 is a cross-sectional view of a TEM picture showing a metal silicide structure of the sidewall layer formed by a manufacturing method according to one embodiment of the present invention.

DETAILED DESCRIPTION OF THE INVENTION

Figure 1A:
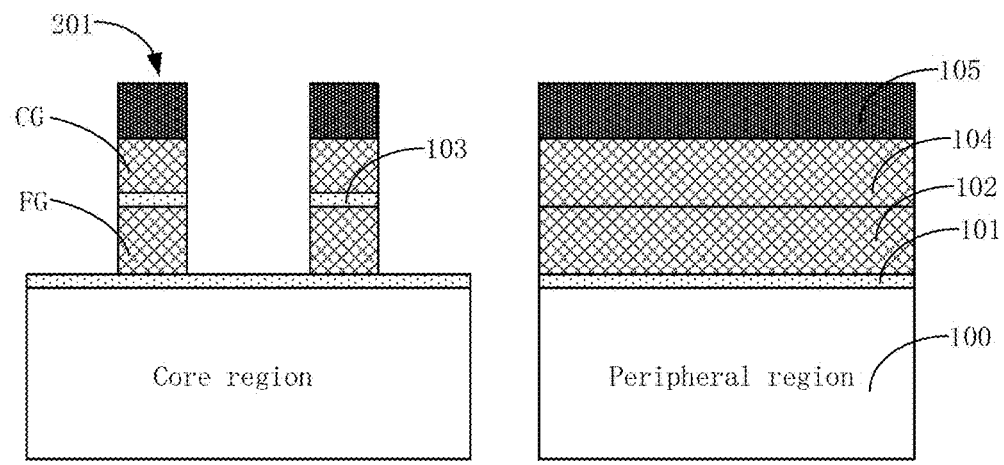
FIGS. 1A through 1W are schematic cross-sectional views illustrating intermediate stages of a semiconductor device manufacturing method according to an embodiment of the present invention.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed, on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

Figure 5:
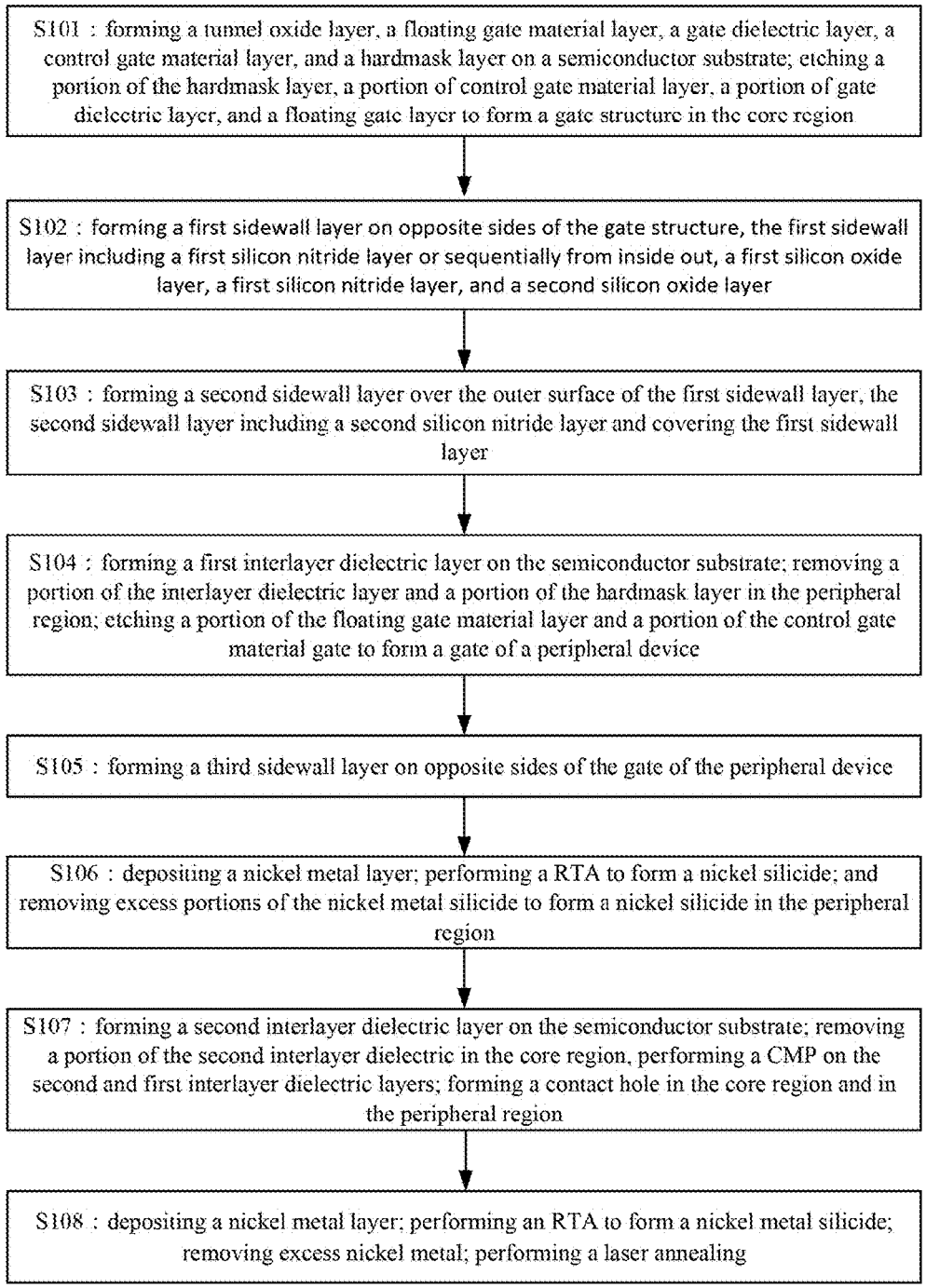
FIG. 5 is a flowchart illustrating a method of manufacturing a semiconductor device according to an embodiment of the present invention.

FIGS. 1A through 1W, FIGS. 2A and 2B, FIGS. 3A and 3B, FIG. 4, and FIG. 5 show exemplary steps of a method for manufacturing a semiconductor device. FIGS. 1A through 1W are schematic cross-sectional views illustrating a semiconductor device at various stages in the fabrication of a semiconductor device. FIG. 2A is a schematic cross-sectional view of an ONO structure of a sidewall layer in the core region formed by a method for manufacturing a semiconductor device, as known in the prior art. FIG. 2B is a schematic cross-sectional view of a TEM picture showing a metal silicide structure of the sidewall layer of FIG. 2A. FIG. 3A is a schematic cross-sectional view of an ON structure of a sidewall layer of the core region formed by a method for manufacturing a semiconductor device, as known in the prior art. FIG. 3B is a schematic cross-sectional view of a TEM picture showing a metal silicide structure of the sidewall layer of FIG. 3A. FIG. 4 is a schematic cross-sectional view of a TEM picture showing a metal silicide structure of the sidewall layer formed by a manufacturing method according to one embodiment of the present invention. FIG. 5 is a flow chart illustrating a method of manufacturing a semiconductor device according to an embodiment of the present invention.

In accordance with the present invention, a method of manufacturing a semiconductor device may include:

A1: providing a semiconductor substrate 100 including a core region and a peripheral region; sequentially forming a tunnel oxide layer 101, a floating gate material layer 102, a gate dielectric layer 103, a control gate material layer 104, and a hardmask layer 105 on semiconductor substrate 100. Gate dielectric layer 103 is disposed in the core region. There is no gate dielectric layer 103 disposed between floating gate material layer 102 and control gate layer 104 in the peripheral region. An etching process is performed on hardmask layer 105, control gate material layer 104, gate dielectric layer 103, and floating gate material layer 102 to form a gate structure 201 of a core device in the core region, as shown in FIG. 1A.

Gate structure 201 includes a control gate (CG) and a floating gate (FG). A gate structure may be embodied in many different forms and should not be construed as limited to the exemplary embodiment as shown.

When performing etching, a photoresist layer may be formed on hardmask layer 105 as a mask. Between the hardmask layer and the photoresist layer, an amorphous carbon layer, a bottom anti-reflective layer (BARC), and other film layers may be formed from bottom to top of the hardmask layer to ensure good etching result. After etching, tunnel oxide layer 101 remains on the surface of semiconductor substrate 101. In an embodiment, the remaining portion of tunnel oxide layer 101 has a thickness of about 40 Å.

Illustratively, tunnel oxide layer 101 may be silicon oxide, floating gate material layer 102 may be doped polysilicon, gate dielectric layer 103 may be silicon oxide/silicon nitride/ silicon oxide, control gate material layer 104 may be doped polysilicon, and hardmask layer 105 may be silicon nitride. Of course, tunnel oxide layer 101, floating gate material layer 102, gate dielectric layer 103, control gate material layer 104, and hardmask layer 105 may be made of other materials, and are not limited to the above-described materials.

Figure 1B:
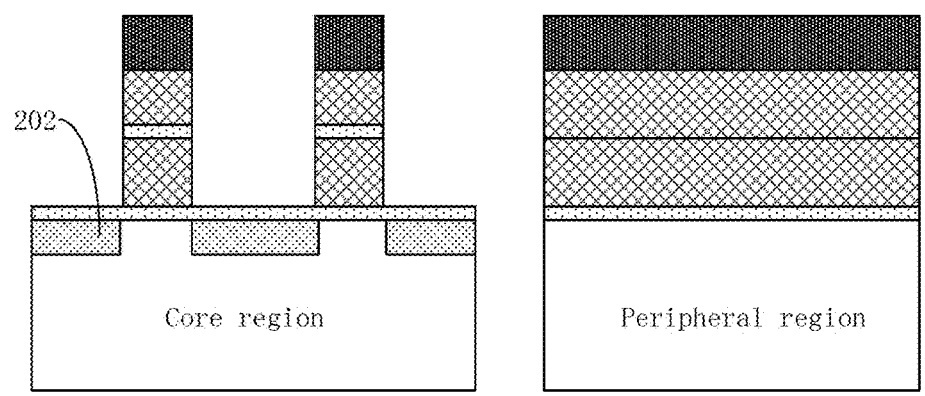

A2: performing an LDD ion implantation into the core region of the semiconductor substrate to form a lightly doped region (LDD) 202 on both sides of gate structure 201, as shown in FIG. 1B.

An LDD ion implantation process can be performed using known techniques. In some embodiments of the present invention, the LDD ion implantation process in step A2 can be omitted.

A3: forming a first sidewall layer 203 on opposite sides of gate structure 201. First sidewall layer 203 includes, from the inside out, a silicon oxide layer 2031, a silicon nitrite layer 2031, and a silicon oxide layer 2033, as shown in FIG. 1D.

Figure 1C:
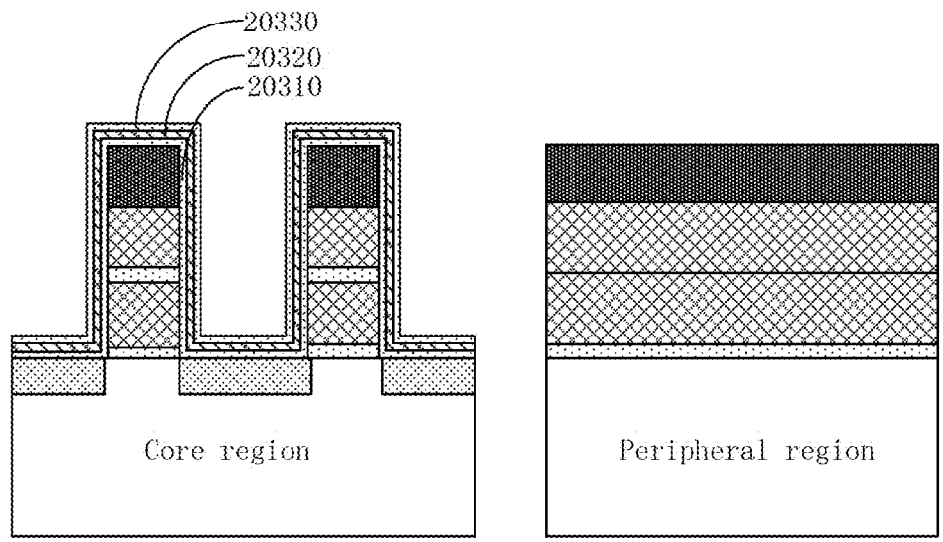
Figure 1D:
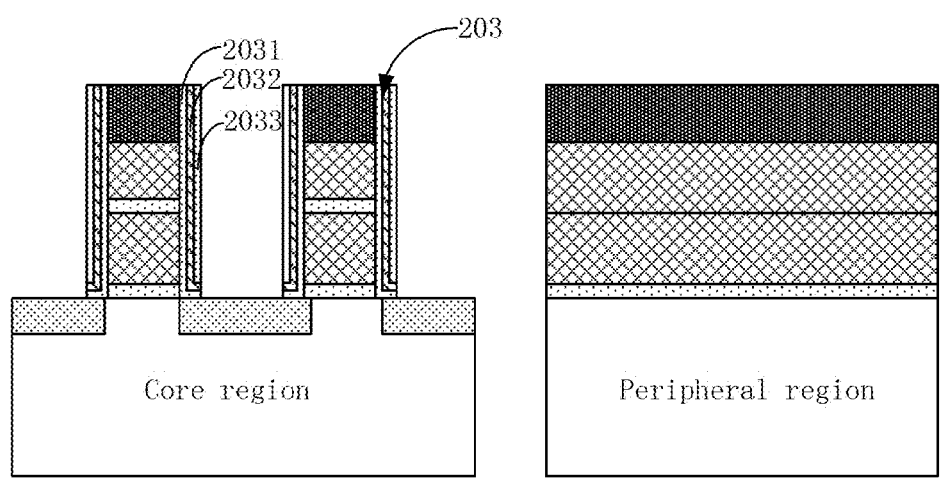

In an embodiment, forming first sidewall layer 203 may include:

Step A301: sequentially forming a bottom silicon oxide layer 20310 on semiconductor substrate 100 through a thermal oxidation, depositing a silicon nitride layer 20320 on bottom silicon oxide layer 20310 through a deposition process, and forming a top silicon oxide layer 20330 on silicon nitride layer 20320 through a thermal oxidation process in an oxidation furnace, as shown in FIG. 1C.

Step A302: performing a dry etching process on top silicon oxide layer 20330, silicon nitride layer 20320, and bottom silicon oxide layer 20310 to expose a top surface of hardmask layer 105 to form first sidewall layer 203. First sidewall layer 203 includes, from inside to outside, silicon oxide layer 2031, silicon nitride layer 2032, and silicon oxide layer 2033, as shown in FIG. 1D.

Figure 1E:
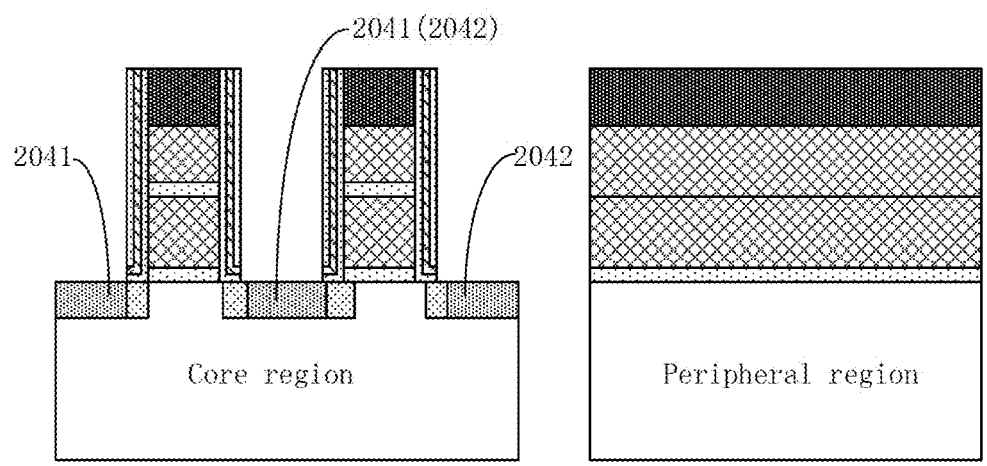

A4: forming a source region 2041 and a drain region 2042 on opposite sides of gate structure 201, as shown in FIG. 1E. Source region 2041 and drain region 2042 can be formed by ion implantation or other techniques.

Figure 1F:
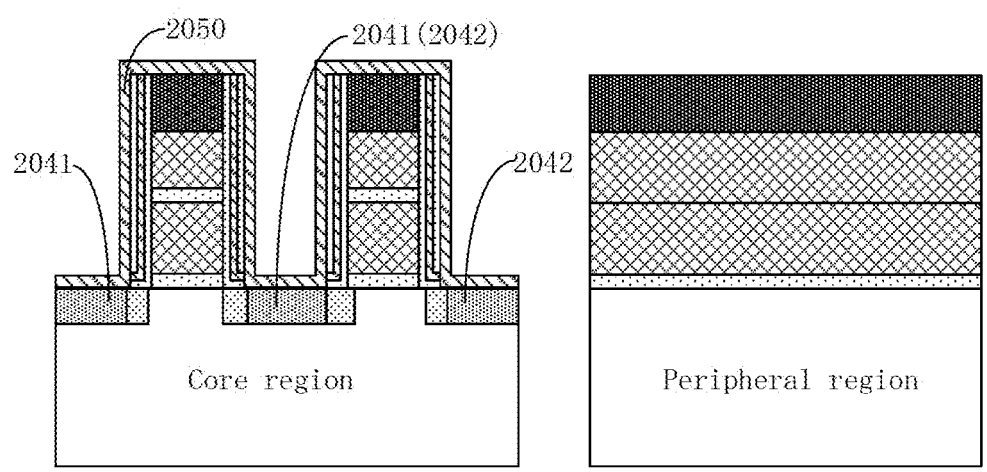
Figure 1G:
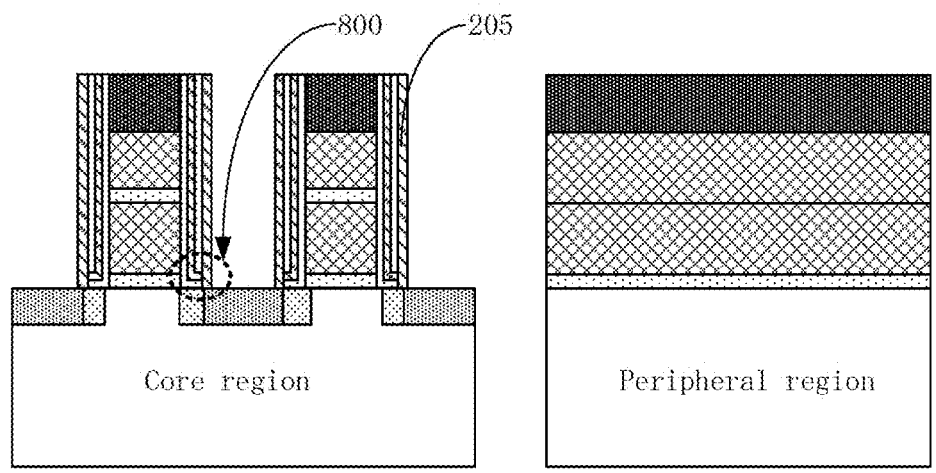

A5: forming a second sidewall layer 205 on first sidewall layer 203, second sidewall layer 205 is made of silicon nitride, as shown in FIG. 1G.

In an embodiment, forming second sidewall layer 205 may include the following steps:

Step A501: forming a conformal silicon nitride layer 2050 on semiconductor substrate 100, as shown in FIG. 1F;

Step A502: performing a dry etching process on silicon nitride layer 2050 to form second sidewall layer 205, as shown in FIG. 1G.

First sidewall layer 203 and second sidewall layer 205 together form the sidewall layer of gate structure 201 of the core device. The sidewall layer includes, from the inside out, a silicon oxide layer 2031, a silicon nitride layer 2032, a silicon oxide layer 2033, and a silicon nitride layer 205 (ONON) to ensure that the bottom portion of the sidewall has a silicon nitride protection. Referring to FIG. 1G, the dotted line circle indicated by reference numeral 800 shows that, within the ONON structure, the outermost layer of silicon nitride 205 completely covers the inside of silicon oxide layer 2031, silicon nitride layer 2032, silicon oxide layer 2033, and the native oxide layer.

In the subsequent process of forming a nickel metal silicide, prior to forming the metal silicide, it is necessary to remove the native oxide layer by a wet etching process. Since the aspect ratio of the core region is relatively high (greater than 8), removing the natural oxide layer by wet etching requires an over-etching to ensure that the native oxide layer is completely removed. In the conventional silicon oxide/silicon nitride (ON) structure, and silicon oxide/silicon nitride/silicon oxide (ONO) structure as the sidewall layer, the gate structure generally includes a silicon oxide in the bottom portion as a protection, so that an etching solution in the wet etching process, such as a diluted HF (DHF) solution, can penetrate into tunnel oxide layer 101, thereby affecting the performance of the device.

FIG. 2A is a schematic cross-sectional view of an ONO structure of a sidewall layer of the core region formed by a conventional method for manufacturing a semiconductor device. As shown in FIG. 2A, in the region marked by a dotted circle and labeled 801, the bottom portion of the silicon oxide in the inner surface of the sidewall is exposed, which causes that the silicon oxide of the bottom portion of the sidewall will be etched in the wet etching process for removing the native oxide layer, resulting in the penetration of the etching solution into the tunnel oxide layer, thereby affecting the device performance. FIG. 2B is a TEM picture showing a metal silicide structure formed in the core region using a conventional method of fabricating a semiconductor device. As can be seen, a metal silicide 810 has been formed extending into the tunnel oxide layer, thereby adversely affecting the device performance.

FIG. 3A is a schematic cross-sectional view of an ON structure of a sidewall layer of the core region formed by a conventional method for manufacturing a semiconductor device. As shown in FIG. 3A, in the region marked by a dotted circle and labeled 802, the bottom portion of the inner surface of the sidewall is exposed, causing that the silicon oxide of the bottom portion of the sidewall can be etched in the wet etching process for removing the native oxide layer, resulting in the penetration of the etching solution into the tunnel oxide layer, thereby affecting the device performance. FIG. 3B is a schematic cross-sectional view of a TEM picture showing a metal silicide structure of the sidewall layer formed by the manufacturing method of FIG. 3A. As can be seen, a metal silicide 820 has been formed extending into the tunnel oxide layer, thereby adversely affecting the device performance.

However, in accordance with embodiments of the present invention, the sidewall structure includes a silicon oxide/silicon nitride/silicon oxide/silicon nitride (ONON), the outermost silicon nitride layer (i.e., second sidewall layer 205) can protect the tunnel oxide layer 101 during the removal of the native oxide (shown in a dotted circle labeled 800 in FIG. 1G) and can ensure that a nickel metal silicide can be normally formed in the active region.

FIG. 4 is a cross-sectional view of a TEM picture showing a metal silicide structure of the sidewall layer formed by a manufacturing method according to an embodiment of the present invention. Obviously, there is no possibility for the etching solution to enter into the tunnel oxide layer, and the metal silicide formed in the core region has good morphology when compared with those of FIGS. 2B and 3B.

Furthermore, in the embodiment of the present invention, the sidewall formed on opposite sides of the gate structure are not limited to the above-described ONON structure, other structures may be possible, such as a silicon nitride/silicon nitride (NN) structure, i.e., a first sidewall layer may be a silicon nitride layer, a second sidewall layer may also be a silicon nitride layer. Of course, both sidewalls formed on opposite sides of the gate structure can have other layer structures.

Figure 1H:
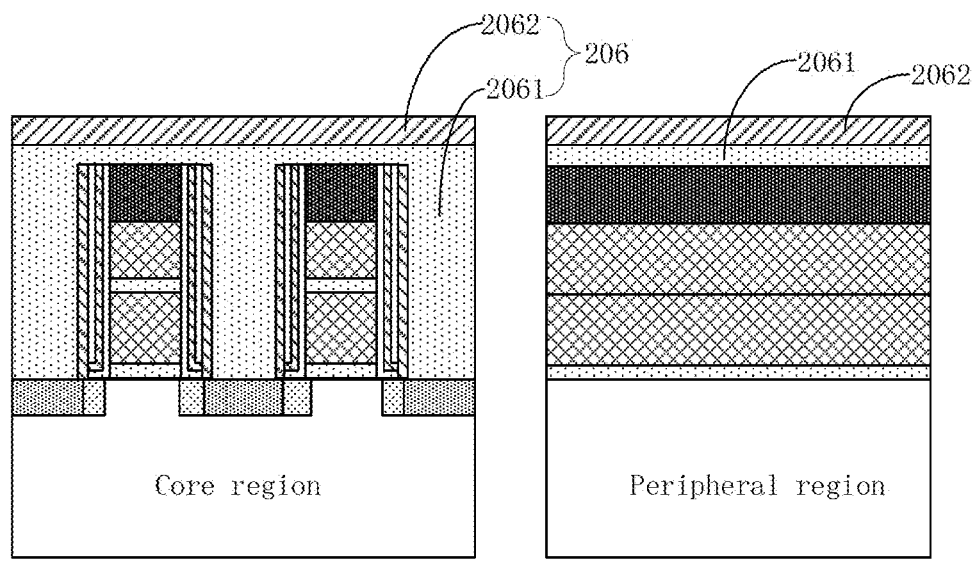

A6: forming a first interlayer dielectric layer 206, as shown in FIG. 1H. First interlayer dielectric layer 206 may be a single-layer structure or a multilayer structure. In an exemplary embodiment, first interlayer dielectric layer 206 is a double-layer structure including an oxide layer 2061 and a polyethylene oxide (PEOX) layer 2062 on the oxide layer, as shown in FIG. 1H. The first interlayer dielectric layer 206 can be formed using a flowable chemical vapor deposition (FCVD) process. The polyethylene oxide (PEOX) layer 2062 can be formed using a deposition process.

Figure 1I:
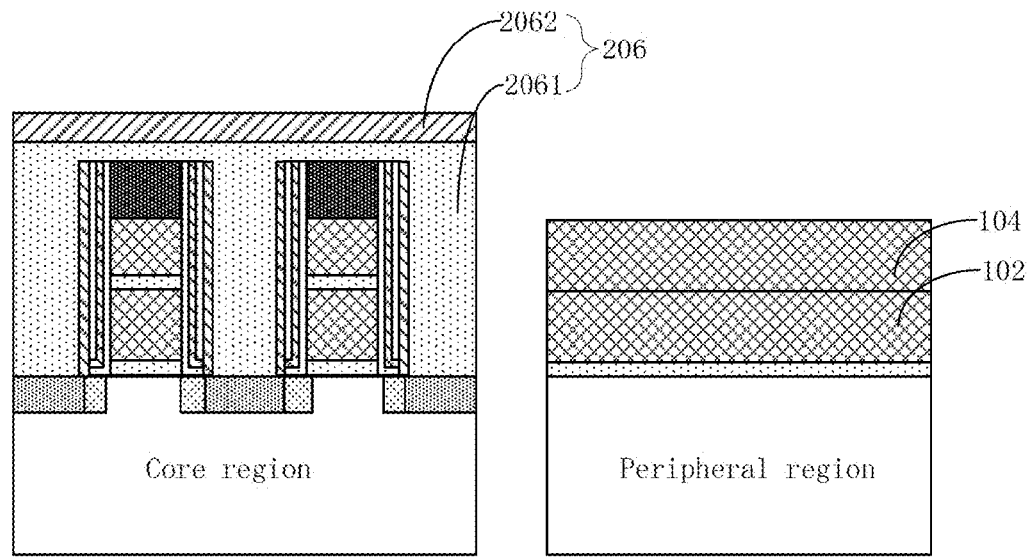

A7: removing a portion of first interlayer dielectric layer 206 and a portion of hardmask layer 105 disposed in the peripheral region, as shown in FIG. 1I. In an exemplary embodiment, first interlayer dielectric layer 206 can be removed using a dry etching or other suitable etching processes. Hardmask layer 105 may be removed using a wet etching or other suitable etching processes.

Figure 1J:
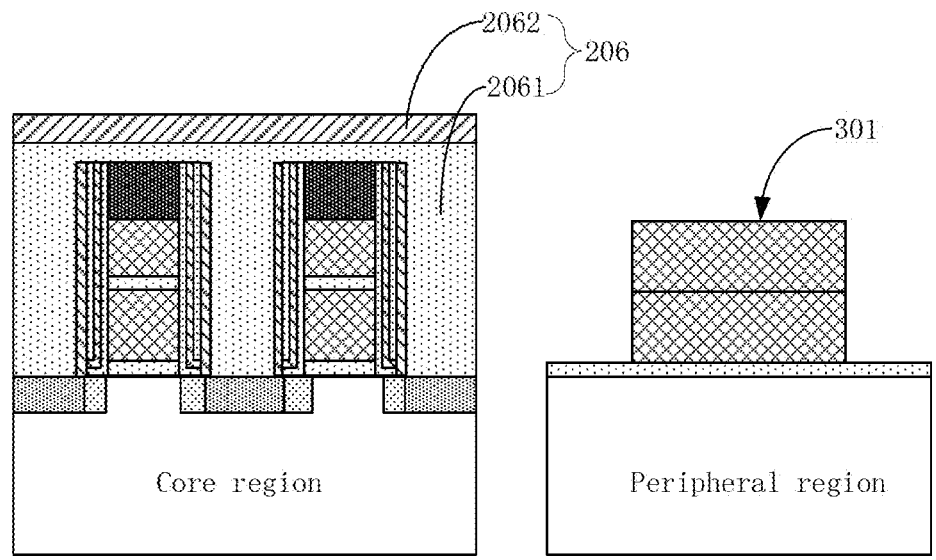

A8: removing floating gate material layer 102 and control gate material layer 104 by etching to form a gate 301 of a peripheral device, as shown in FIG. 1J. Floating gate material layer 102 and control gate material layer 104 can be removed using a dry etching process or other suitable etching processes.

Figure 1K:
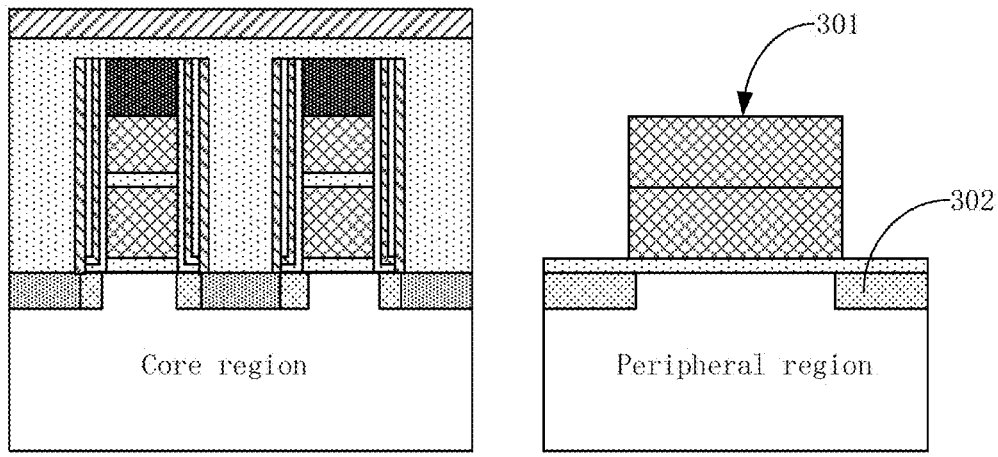

A9: performing a shallow low energy ion implantation into the peripheral region to form a lightly doped source and drain (LDD) region 302 on adjacent sides of gate electrode 301 of the peripheral device, as shown in FIG. 1K. The shallow low energy ion implantation can be performed using any suitable low energy ion implantation. In the embodiment, step A9 can be omitted.

Figure 1L:
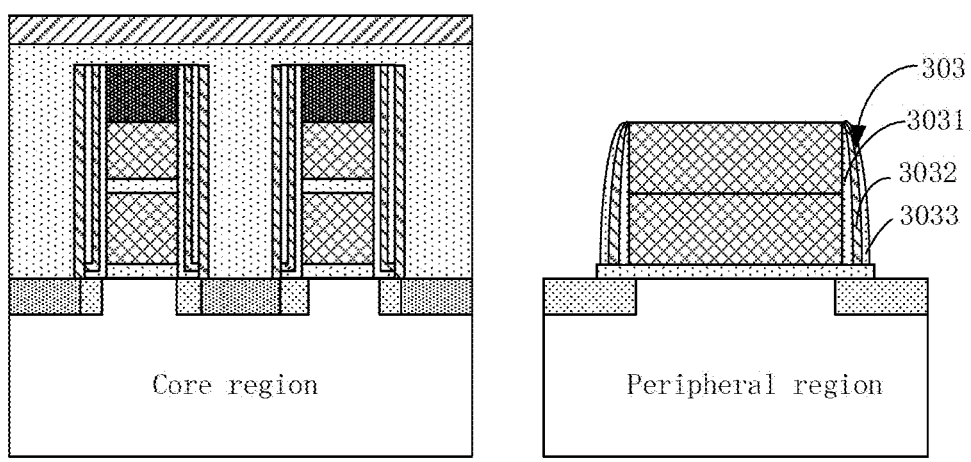
Figure 1M:
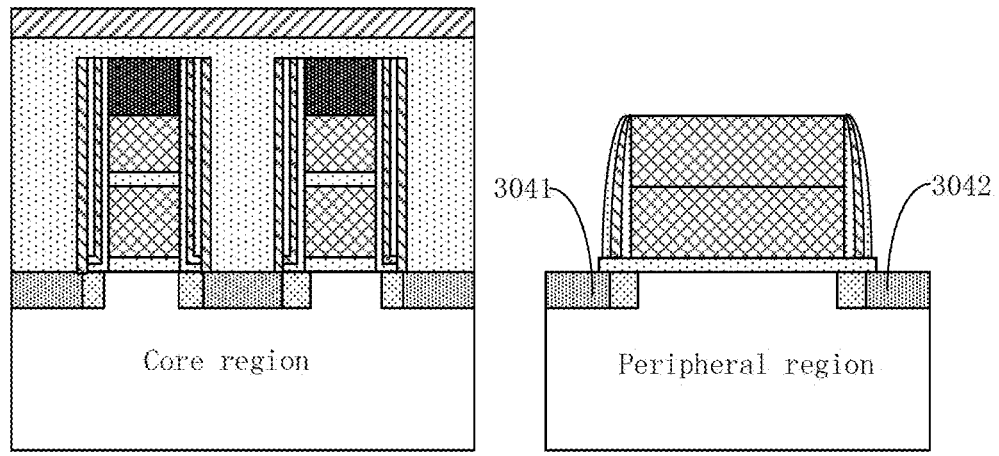

A10: forming a third sidewall layer 303 on opposite sides of gate 301 of the peripheral device. Third sidewall layer 303 includes, from the inside out, a silicon oxide layer 3031, a silicon nitride layer 3032, and a silicon oxide layer 3033, as shown in FIG. 1L.

In an exemplary embodiment, forming third sidewall layer 303 may include sequentially forming a silicon oxide layer on semiconductor substrate 100 through oxidation, depositing a silicon nitrite layer on the silicon oxide layer, and performing a dry etch process on the silicon oxide layer and the silicon nitrite layer to form a first portion of third sidewall layer 303 disposed on opposite sides of gate 301 of the peripheral device; and depositing on semiconductor substrate 100 a second silicon oxide layer, performing a dry etching process on the second silicon oxide layer to form a second portion disposed on the external surface of the first portion of third sidewall layer 303. The first portion of third sidewall layer 303 and the second portion of third sidewall layer 303 constitute third sidewall layer 303.

A11: forming a source 3041 and a drain 3042 on adjacent sides of gate 301 of the peripheral device. Source 3041 and a drain 3042 can be formed using an ion implantation process.

Figure 1N:
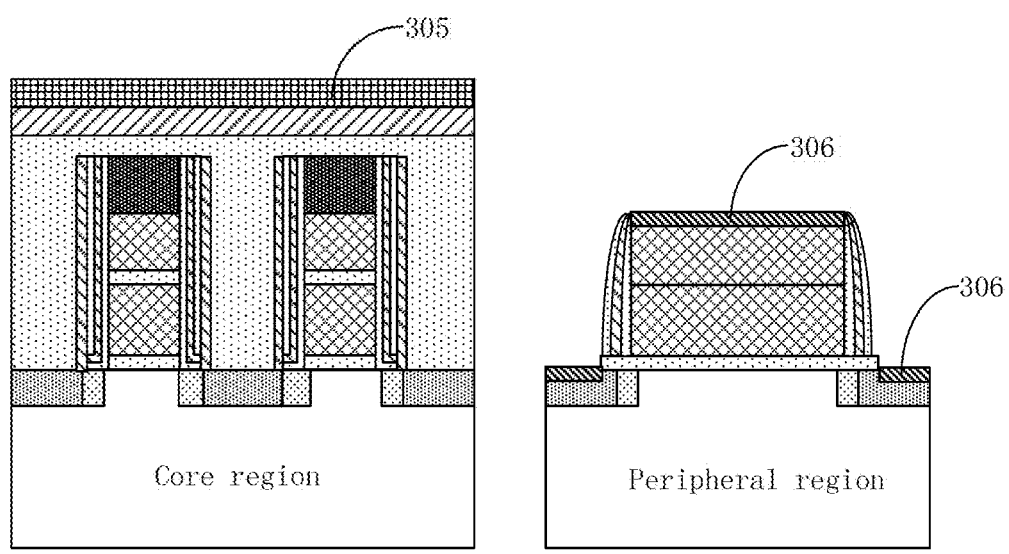

A12: forming a metal silicide mask layer (silicide alignment block or SAB) 305 on semiconductor substrate, thereafter, forming a metal silicide layer 306 on the peripheral region. Metal silicide layer 306 is disposed on the source, drain, and gate of the peripheral device, as shown in FIG. 1N.

In the embodiment, metal silicide mask layer (SAB) 305 may be formed using any conventional techniques. For example, a silicon oxide layer is deposited and then etched. The silicon oxide layer can be a silicon rich oxide (SRO).

In an exemplary embodiment, metal silicide mask layer (SAB) 305 may be removed in the peripheral region using a dry etching process to form the required metal silicide layer in the core region. A photoresist can be used as a mask for etching. After the dry etching, a portion of tunnel oxide layer 101 may remain on the surface of semiconductor substrate 100. A wet etching may be further performed to remove the remaining portion of tunnel oxide layer 101.

In an embodiment, metal silicide layer 306 may be formed using the following steps: depositing a nickel (Ni) metal layer; performing a rapid thermal annealing (RTA) process to of greater than 20 seconds; and selectively removing excess portions of nickel.

The above-described RTA process is a low-temperature RTA process to ensure that nickel reacts with silicon to form a metal silicide (NiSi).

In the prior art, after the removal of excess nickel, the method further includes performing a high-temperature RTA (RTA2). In accordance with the present invention, the method does not include the high-temperature RTA process. In other words, the second high-temperature RTA required in the prior art is omitted in the method according to the present invention, so that the peripheral region does not have to go through two high-temperature RTA processes (a high-temperature RTA process will be performed in subsequent metal silicide formation in the core region).

In an exemplary embodiment, the deposited nickel layer has a thickness greater than 200 Å, to ensure that semiconductor substrate 100 has a sufficient amount of nickel for forming a metal silicide on the source and drain of the peripheral device. If a metal silicide is concurrently formed in the core region and in the peripheral region, it will result in a significant loss in the silicon in the peripheral region for forming a thick metal silicide and adversely affect the associated source and drain.

Figure 1O:
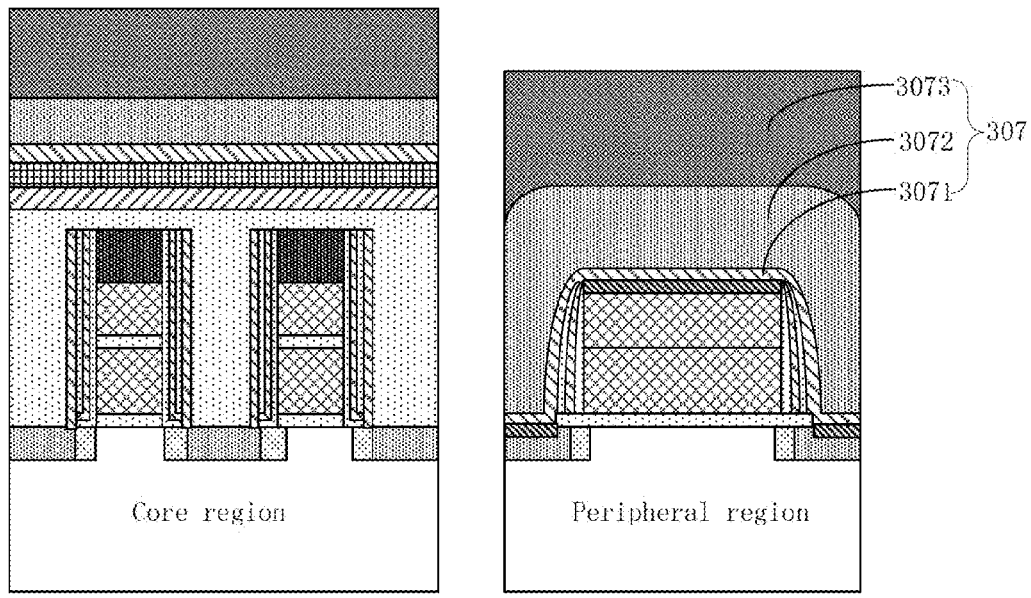

A13: forming a second interlayer dielectric layer 307, as shown in FIG. 1O. Second interlayer dielectric layer 307 may be a single layer structure or a multilayer structure. In an exemplary embodiment, second interlayer dielectric layer 307 is a three-layer structure including, from bottom to top, a silicon nitride layer 3071, a high-aspect ratio material layer (HARP) 3072, and a polyethylene oxide (PEOX) layer 3073, as shown in FIG. 1O. Silicon nitride layer 3071 can be formed by thermal CVD in a process chamber. High-aspect ratio material layer (HARP) 3072 may be formed using a high-aspect deposition process and may be made of a silicon oxide or other suitable materials. Polyethylene oxide (PEOX) layer 3073 can be formed using a deposition process.

In the embodiment, second interlayer dielectric layer 307 and first interlayer dielectric layer 206 are collectively referred to as the interlayer dielectric layer.

Figure 1P:
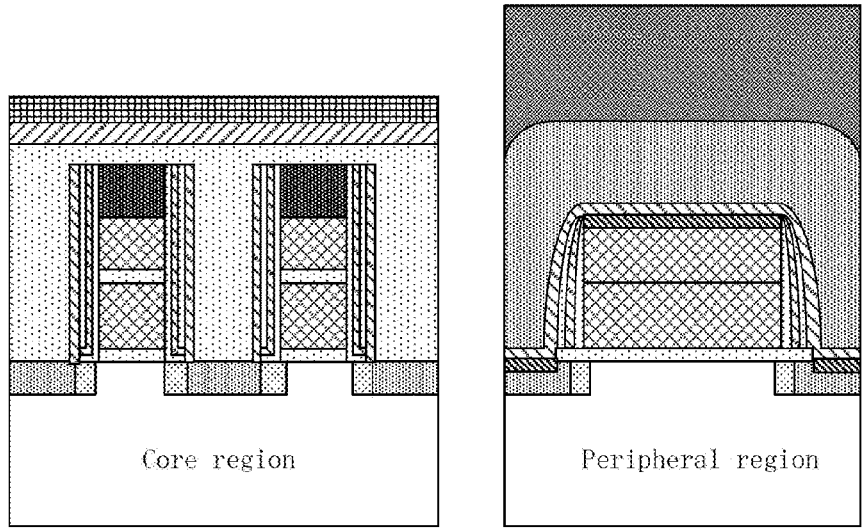

A14: removing a portion of second interlayer dielectric layer 307 in the core region, as shown in FIG. 1P. The portion of second interlayer dielectric layer 307 can be removed using an etching process or other suitable process.

Removing a portion of second interlayer dielectric layer 307 in the core region is to reduce the difference in height (or thickness) between the core region and the peripheral region, to improve the result of a subsequent CMP process.

Figure 1Q:
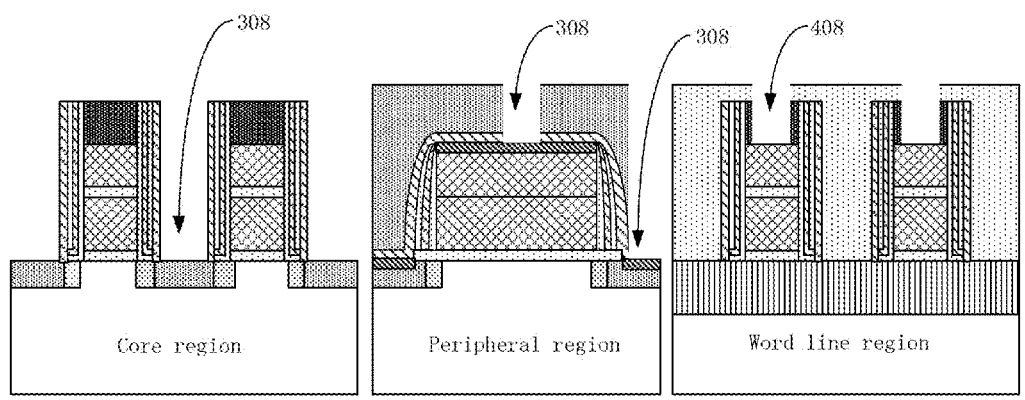

A15: performing a chemical mechanical polishing (CMP) planarization process on second interlayer dielectric layer 307 and first interlayer dielectric layer 206, then, forming a contact hole 308 at the location of the metal silicide in the core region and in the peripheral region by etching, thereafter, forming contact hole 408 at the location of a contact plug in a word line region, as shown in FIG. 1Q.

Contact hole 308 and contact hole 408 can be formed using a dry etching process or other suitable processes.

As those skilled in the art will appreciate, the word line (WL) region is generally located in the core region. In the description of the embodiment of the present invention, in order to illustrate the change in associated steps in the word line region, a cross-sectional view of a single word line is shown.

In the embodiment, contact hole 308 and contact hole 408 can be formed by etching or other suitable techniques. In the core region and in the peripheral region, based on actual design requirements, contact holes can be formed over the location of the source, the drain, and the gate.

Figure 1R:
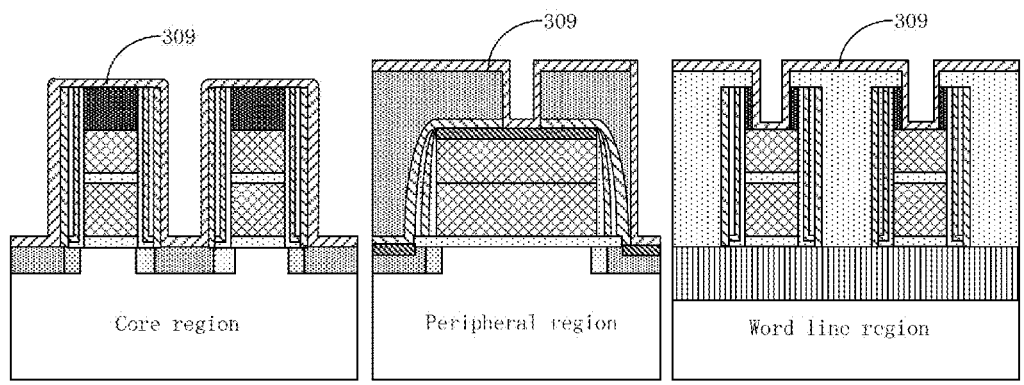

A16: depositing a nickel metal layer 309 on semiconductor substrate 100, as shown in FIG. 1R. Nickel metal layer 309 covers the exposed surface of contact hole 308 and contact hole 408.

In advanced semiconductor device technology, such as 45 nm and below, the core region aspect ratio is large, and the step coverage of the deposited nickel metal is relatively small, therefore, the deposited nickel should have a thickness greater than 200 Å in order to ensure that the surface of semiconductor substrate 100 has a sufficient amount of nickel to form a good metal silicide.

In an embodiment, prior to depositing the nickel layer, the method may include removing a native oxide layer on semiconductor substrate 100. The removal of the native oxide layer can include a wet etching process such as DHF or other suitable etching processes.

Figure 1S:
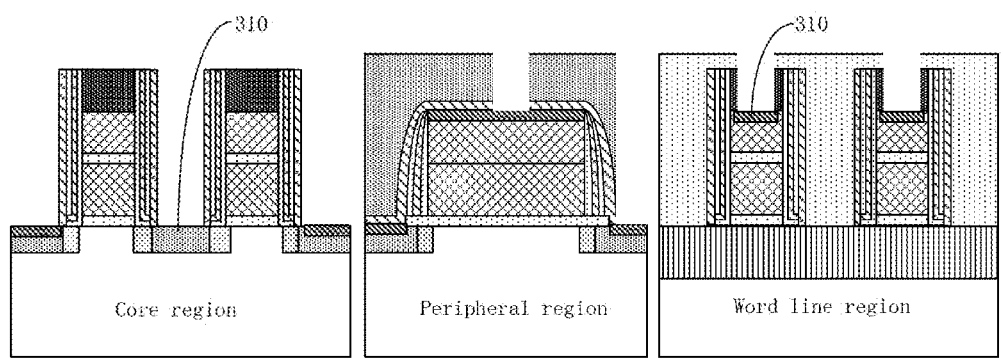

A17: performing a rapid thermal annealing (RTA) process, selectively removing excess nickel metal, performing a laser annealing to form a nickel metal silicide 310 in the core region, as shown in FIG. 1S.

Nickel metal silicide 310 is located within contact hole 308 and contact hole 310.

In the embodiment, the core region uses a nickel metal to form a metal silicide. In contrast, in the prior art, titanium (Ti) is used in the core region and has a lower thermal budget.

Because the sidewall layer in the core region includes an ONON structure, the formed nickel metal silicide 310 has good morphology. FIG. 4 shows a TEM picture of a metal silicide structure of the core region formed by a method according to an embodiment of the present invention. The metal silicide structure is clearly shown to have good morphology.

In the embodiment, the RTA process is performed at a temperature of about 200° C. to about 350° C., with a time duration greater than 20 seconds to ensure nickel reacts with silicon to form a metal silicide (NiSi).

Excess portions of the nickel metal can be selectively removing by a wet etching process.

The laser annealing process can be performed at a temperature of about 700° C. to 1000° C. with a process time duration less than 1 second. The laser annealing process is a high-temperature annealing process. On one hand, the metal silicide (NiSi) in the core region and in the peripheral region can be quickly changed from a high-impedance state to a low-impedance state, which can reduce the surface resistance of the metal silicide (NiSi). On the other hand, because the laser annealing process is very short (<1 second), shorter than the rapid thermal annealing or spike annealing used in the prior art, so that the laser annealing process only has a relatively small effect on the metal silicide (NiSi) and on the source, drain, and the associated semiconductor substrate.

Figure 1T:
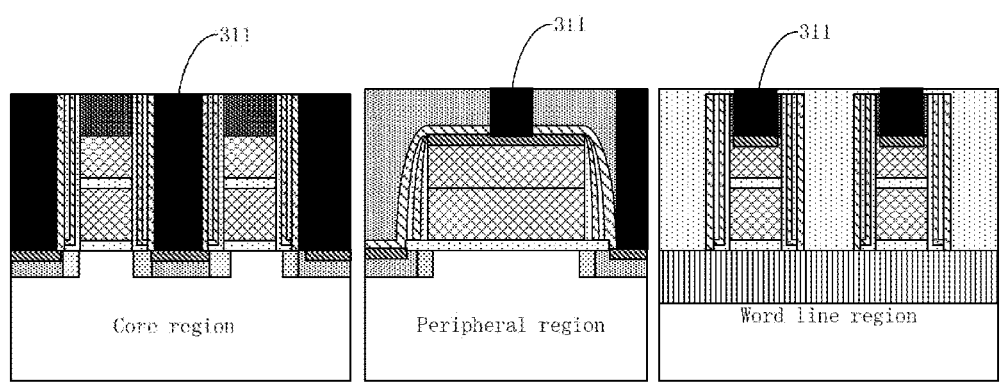

A18: depositing an interconnect material that is in contact with nickel metal silicide 310 and filling contact hole 308 and contact hole 310; performing a CMP planarization process to form a metal plug 311, as shown in FIG. 1T.

In an embodiment, step A18 may include: depositing a barrier layer having a certain thickness on the bottom and sidewalls of the contact holes. The barrier layer may be Ti and/or TiN. Step 18 also includes filling the contact holes with a metal material, such as tungsten; and removing excess of the metal material and excess of the barrier layer using a CMP process to form a metal plug 311.

Figure 1U:
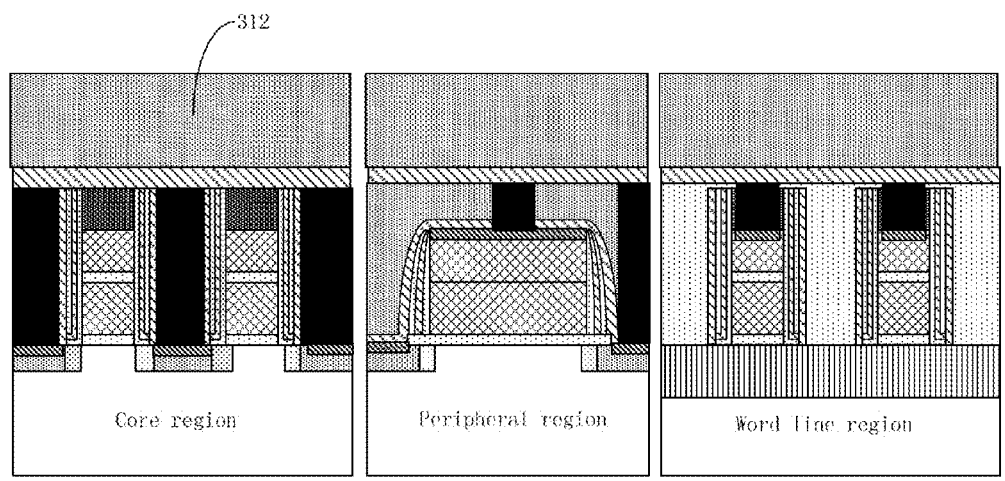
Figure 1V:
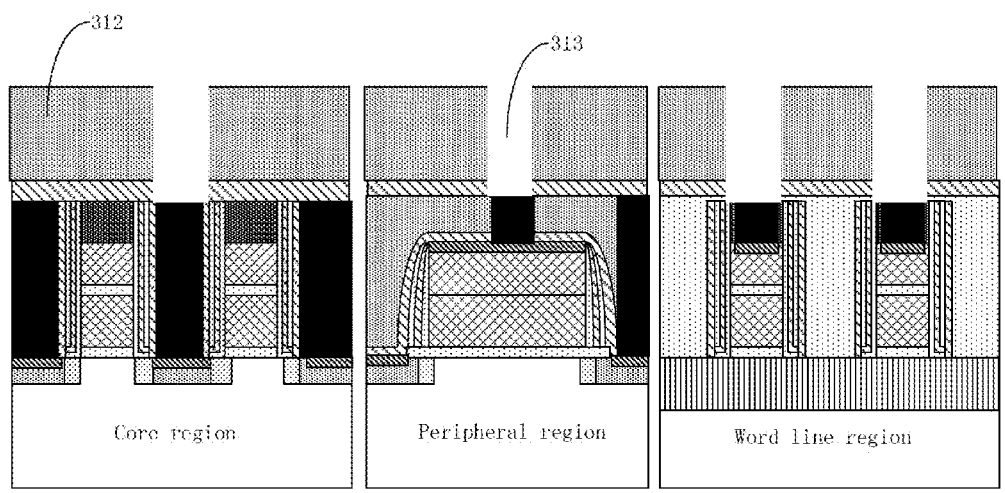

This completes the description of the key steps of a method for manufacturing a semiconductor device according to an embodiment of the present invention. Those of skill in the art will appreciate that, in addition to the above-mentioned steps A1 through A18, the method may also include other possible steps after step A18, and it is not limited thereto. Illustratively, the method may also include the following steps after step A18:

A19: forming an interlayer dielectric layer 312, as shown in FIG. 1U;

A20: forming a contact hole 313 in interlayer dielectric layer 312, as shown in FIG. 1V;

A21: forming a metal plug 314 at the location of contact hole 313, as shown in FIG. 1W.

Interlayer dielectric layer 312 may be a single layer or a multilayer structure. Interlayer dielectric layer 312 may include silicon oxide and/or silicon nitride. Contact hole 313 is located above metal plug 311. Metal plug 314 may include a barrier layer located on the bottom and the sidewalls of contact hole 313. The barrier layer may be Ti and/or TiN. The metal layer located on the barrier layer may be tungsten or other suitable metal.

In accordance with the present invention, the method for manufacturing a semiconductor device includes, prior to forming the metal silicide in the core region, forming outwardly (from the inside out) a silicon oxide layer 2031, a silicon nitride layer 2032, a silicon oxide layer 2033, and silicon nitride layer 205 on sidewalls of gate structure 201; or forming outwardly a first silicon nitride layer and a second silicon nitride layer on sidewalls of gate structure 201, the metal silicide has a good shape in the core area to ensure the device performance.

Furthermore, forming metal silicide 306 in the peripheral region does not include a high-temperature rapid thermal annealing that is required after the removal excess nickel material of the prior art, and forming nickel metal silicide 310 in the core region includes a laser annealing process after removing excess nickel metal, so that a good metal silicide (NiSi) can be formed both in the core region and in the peripheral region.

Because it is possible to form a good metal silicide in the core region, the surface resistance (Rs) of the contact hole (CT) and the surface resistance of the word line region (WL strap), thereby improving the performance of the program cycle and erase cycle of the storage unit.

FIG. 5 is a flow chart diagram illustrating a method for manufacturing a semiconductor device according to an embodiment of the present invention. The method may include:

S101: providing a semiconductor substrate including a core region and a peripheral region; sequentially forming a tunnel oxide layer, a floating gate material layer, a gate dielectric layer, a control gate material layer, and a hardmask layer on the semiconductor substrate; performing an etching process on the hardmask layer, the control gate material layer, the gate dielectric layer, and the floating gate material layer in the core region to form a gate structure;

S102: forming a first sidewall layer on opposite sides of the gate structure. The first sidewall layer includes a first silicon nitride layer, or, from the inside out, a first silicon nitride layer and a second silicon oxide layer;

S103: forming a second sidewall layer on the first sidewall layer. The second sidewall layer includes a second silicon nitride layer covering the first sidewall layer;

S104: forming a first interlayer dielectric layer on the semiconductor substrate; removing a portion of the first interlayer dielectric layer in the peripheral region and a portion of the hardmask layer in the peripheral region; performing an etching process on a portion of the floating gate material layer and a portion of the control gate material layer in the peripheral region to form a gate of a peripheral device;

S105: forming a third sidewall layer on opposite sides of the gate of the peripheral device;

S106: performing the following steps to form a metal silicide: depositing a nickel metal layer, and performing a rapid thermal annealing to form a nickel metal silicide; removing excess portions of the nickel metal layer;

S107: forming a second interlayer dielectric layer, removing a portion of the second interlayer dielectric layer located in the core region; performing a CMP process on the second interlayer dielectric layer and the first interlayer dielectric layer; forming a contact hole in the core region and in the peripheral region;

S108: performing the following steps in the core region to form a metal silicide: depositing a nickel metal layer; and performing a rapid thermal annealing to form a nickel metal silicide; removing excess portions of the nickel metal layer; and performing a laser annealing on the nickel metal silicide.

Embodiments of the present invention provide an electronic apparatus including an electronic component and a semiconductor device connected to the electronic component. The semiconductor device can be manufacturing according to the above-described method. The electronic component can be any suitable component.

In an embodiment, the semiconductor device can be fabricated using a method including the following steps:

S101: forming a tunnel oxide layer on a semiconductor substrate; a floating gate material layer, a gate dielectric layer, a control gate material layer, and a hardmask layer; performing an etching process on the hardmask layer, the control gate material layer, the gate dielectric layer, and the floating gate material layer in the core region to form a gate structure;

S102: forming a first sidewall layer on opposite sides of the gate structure. The first sidewall layer includes a first silicon nitride layer, or outwardly (from the inside out) a first silicon nitride layer and a second silicon oxide layer;

S103: forming a second sidewall layer on the first sidewall layer. The second sidewall layer includes a second silicon nitride layer covering the first sidewall layer;

S104: forming an interlayer dielectric layer on the semiconductor substrate; removing a portion of the first interlayer dielectric layer in the peripheral region and a portion of the hardmask layer in the peripheral region; performing an etching process on a portion of the floating gate material layer and a portion of the control gate material layer in the peripheral region to form a gate of a peripheral device;

S105: forming a third sidewall layer on opposite sides of the gate of the peripheral device;

S106: performing the following steps to form a metal silicide: depositing a nickel metal layer, and performing a rapid thermal annealing to form a nickel metal silicide; removing excess nickel metal layer;

S107: forming a second interlayer dielectric layer, removing a portion of the second interlayer dielectric layer located in the core region; performing a CMP on the second interlayer dielectric layer and the first interlayer dielectric layer; forming a contact hole in the core region and in the peripheral region;

S108: performing the following steps in the core region to form a metal silicide: depositing a nickel metal layer; and performing a rapid thermal annealing to form a nickel metal silicide; removing excess nickel metal; and performing a laser annealing.

In accordance with the present invention, the electronic device may be a mobile phone, a laptop computer, a netbook, a tablet PC, a game console, a TV, a DVD player, a GPS device, a camera, a voice recorder, MP3, MP4, PSP players, and other semiconductor devices including intermediate products and electronic components that are manufactured using the above-described method to improve reliability and performance.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a semiconductor device; the method comprising the following steps:

S101: providing a semiconductor substrate having a core region and a peripheral region;

sequentially forming a tunnel oxide layer; a floating gate material layer, a gate dielectric layer, a control gate material layer, and a hardmask layer on the semiconductor substrate;

performing an etching process on the hardmask layer, the control gate material layer, the gate dielectric layer, and the floating gate material layer in the core region to form a gate structure;

S102: forming a first sidewall layer on opposite sides of the gate structure, the first sidewall layer including a first silicon oxide layer having a continuous inner surface in contact with a side surface of the tunnel oxide layer, in contact with a side surface of the floating gate material layer, in contact with a side surface of the gate dielectric layer, in contact with a side surface of the control gate material layer, and in contact with a side surface of the hardmask layer, a first silicon nitride layer on an outer surface of the first silicon oxide layer, and a second silicon oxide layer on the first silicon nitride layer;

S103: forming a second sidewall layer on the first sidewall layer, the second sidewall layer including a second silicon nitride layer covering a side surface of the first silicon oxide layer, a side surface of the first silicon nitride layer, and a side surface of the second silicon oxide layer;

S104: forming a first interlayer dielectric layer on the semiconductor substrate;

removing a portion of the first interlayer dielectric layer in the peripheral region and a portion of the hardmask layer in the peripheral region;

performing an etching process on a portion of the floating gate material layer and a portion of the control gate material layer in the peripheral region to form a gate of a peripheral device;

S105: forming a third sidewall layer on opposite sides of the gate of the peripheral device;

S106: depositing a nickel metal layer;

performing a rapid thermal annealing to form a nickel metal silicide;

removing excess portions of the nickel metal layer;

S107: forming a second interlayer dielectric layer;

removing a portion of the second interlayer dielectric layer located in the core region;

performing a CMP on the second interlayer dielectric layer and the first interlayer dielectric layer;

forming a contact hole in the core region and in the peripheral region;

S108: performing the following steps in the core region to form a metal silicide:

depositing a nickel metal layer;

performing a rapid thermal annealing to form a nickel metal silicide;

removing excess nickel metal; and performing a laser annealing.

2. The method of claim 1, wherein the step S102 comprises:

sequentially forming a bottom silicon oxide layer on semiconductor substrate through oxidation, depositing a silicon nitride layer on the bottom silicon oxide layer, and forming a top silicon oxide layer on the silicon nitride layer; and performing a dry etch process on the top silicon oxide layer, the silicon nitride layer, and the bottom silicon oxide layer to expose a top surface of the hardmask layer to form a first sidewall layer, the first sidewall layer including, from inside to outside, the silicon oxide layer, the silicon nitride layer, and the silicon oxide layer.

3. The method of claim 2, wherein the step S103 comprises:

forming a silicon nitride layer on the semiconductor substrate;

performing a dry etching on an outer surface of the silicon nitride layer to form the second sidewall layer, the second sidewall layer covering the first sidewall layer.

4. The method of claim 1, further comprising, between the steps S102 and S103:

forming a source and a drain on adjacent sides of the gate structure in the core region.

5. The method of claim 1, wherein in the step S107 the contact hole comprises a contact hole located in a word line region; and the step S108 further comprises forming a nickel metal silicide in the contact hole in the word line region.

6. The method of claim 1, wherein in the step S106 the deposited nickel metal layer has a thickness greater than 200 Å.

7. The method of claim 1, wherein in the step S106 the rapid thermal annealing is performed at a temperature in a range between 200° C. and 350° C., and for a time duration greater than 20 seconds.

8. The method of claim 1, wherein in the step S108 the rapid thermal annealing is performed at a temperature in a range between 200° C. and 350° C., and for a time duration greater than 20 seconds.

9. The method of claim 1, wherein in the step S108 the laser annealing is performed at a temperature in a range between 700° C. and 1000° C., and for a time duration less than 1 second.

10. The method of claim 1, wherein in the step S108 the deposited nickel metal layer has a thickness greater than 200 Å.

11. The method of claim 1, further comprising, after the step S108:

forming a metal plug in the contact hole.

12. The method of claim 1, further comprising, prior to the step S102:

performing an ion implantation to form a lightly doped drain (LDD) region on opposite sides of the gate structure, wherein the first sidewall layer is formed on a portion of the LDD region.

13. A method for manufacturing a semiconductor device; the method comprising the following steps:

S101: providing a semiconductor substrate having a core region and a peripheral region;

sequentially forming a tunnel oxide layer; a floating gate material layer, a gate dielectric layer, a control gate material layer, and a hardmask layer on the semiconductor substrate;

performing an etching process on the hardmask layer, the control gate material layer, the gate dielectric layer, and the floating gate material layer in the core region to form a gate structure;

S102: forming a first silicon nitride sidewall layer on opposite sides of the gate structure, the first sidewall layer including an inner surface in contact with a side surface of the tunnel oxide layer, in contact with a side surface of the floating gate material layer, in contact with a side surface of the gate dielectric layer, in contact with a side surface of the control gate material layer, and in contact with a side surface of the hardmask layer;

S103: forming a second silicon nitride sidewall layer on the first silicon nitride sidewall layer;

S104: forming a first interlayer dielectric layer on the semiconductor substrate;

removing a portion of the first interlayer dielectric layer in the peripheral region and a portion of the hardmask layer in the peripheral region;

performing an etching process on a portion of the floating gate material layer and a portion of the control gate material layer in the peripheral region to form a gate of a peripheral device;

S105: forming a third sidewall layer on opposite sides of the gate of the peripheral device;

S106: depositing a nickel metal layer;

performing a rapid thermal annealing to form a nickel metal silicide;

removing excess portions of the nickel metal layer;

S107: forming a second interlayer dielectric layer;

removing a portion of the second interlayer dielectric layer located in the core region;

performing a CMP on the second interlayer dielectric layer and the first interlayer dielectric layer;

forming a contact hole in the core region and in the peripheral region;

S108: performing the following steps in the core region to form a metal silicide:

depositing a nickel metal layer;

performing a rapid thermal annealing to form a nickel metal silicide;
removing excess nickel metal; and
performing a laser annealing.

14. The method of claim 13, wherein the step S103 comprises:
forming a conformal silicon nitride layer on the semiconductor substrate; and
performing a dry etching process on the conformal silicon nitride layer to form the second sidewall layer.

* * * * *